US 6,550,664 B2

(12) United States Patent
Bradley et al.

(10) Patent No.: US 6,550,664 B2
(45) Date of Patent: Apr. 22, 2003

(54) MOUNTING FILM BULK ACOUSTIC RESONATORS IN MICROWAVE PACKAGES USING FLIP CHIP BONDING TECHNOLOGY

(75) Inventors: Paul Bradley, Mountain View, CA (US); John D. Larson, III, Palo Alto, CA (US); Richard C. Ruby, Menlo Park, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 137 days.

(21) Appl. No.: 09/733,704

(22) Filed: Dec. 9, 2000

(65) Prior Publication Data

US 2002/0070262 A1 Jun. 13, 2002

(51) Int. Cl.⁷ ........................... B23K 31/02; H04R 17/00
(52) U.S. Cl. ............................... 228/179.1; 228/180.22; 310/322; 310/346; 29/25.35
(58) Field of Search ............................ 228/179.1, 180.22; 333/186–192, 193; 29/25.35; 310/346, 322; 438/118

(56) References Cited

U.S. PATENT DOCUMENTS

| | | | | | |
|---|---|---|---|---|---|
| 3,832,761 A | * | 9/1974 | Sheahan et al. | ............ | 29/25.35 |
| 5,303,457 A | * | 4/1994 | Falkner et al. | ............... | 156/322 |
| 5,307,311 A | * | 4/1994 | Sliwa, Jr. | ................. | 250/339.12 |
| 5,406,682 A | * | 4/1995 | Zimnicki et al. | ........... | 29/25.35 |
| 5,438,305 A | * | 8/1995 | Hikita et al. | ................ | 174/52.1 |
| 5,789,845 A | * | 8/1998 | Wadaka et al. | .............. | 310/311 |
| 5,869,749 A | * | 2/1999 | Bonne et al. | ........... | 250/339.12 |
| 5,892,417 A | * | 4/1999 | Johnson et al. | .............. | 333/193 |
| 5,969,461 A | * | 10/1999 | Anderson et al. | ........... | 29/25.35 |
| 6,236,145 B1 | * | 2/2000 | Biernacki | ..................... | 310/346 |
| 6,081,171 A | * | 6/2000 | Ella | ............................ | 310/348 |
| 6,087,198 A | * | 7/2000 | Panasik | ....................... | 438/118 |
| 6,239,536 B1 | * | 5/2001 | Lakin | ............................ | 310/364 |
| 6,262,637 B1 | * | 7/2001 | Bradley et al. | .............. | 310/322 |
| 6,285,559 B1 | * | 9/2001 | Fukiharu | ..................... | 333/186 |
| 6,297,072 B1 | * | 10/2001 | Tilmans et al. | .............. | 438/106 |
| 6,377,137 B1 | * | 4/2002 | Ruby | ........................... | 310/311 |

* cited by examiner

*Primary Examiner*—Tom Dunn
*Assistant Examiner*—L. Edmondson

(57) ABSTRACT

A device includes a die that contains a filter circuit. The filter is implemented using film bulk acoustic resonators. A package contains the die. The package includes a base portion. Signal paths are incorporated in the base portion. Solder joints attach the die to the base portion. The solder joints electrically connect pads on the die to the signal paths in the base portion. The solder joints do not include, and are used instead of, wire bonds.

12 Claims, 4 Drawing Sheets

MOUNTING FILM BULK ACOUSTIC RESONATORS IN MICROWAVE PACKAGES USING FLIP CHIP BONDING TECHNOLOGY

BACKGROUND

The present invention concerns radio frequency (RF) filters and pertains particularly to mounting film bulk acoustic resonator filters in microwave packages using flip chip bonding technology.

For applications such as cellular phones, it is desirable to reduce the size of components. Particularly, it is desirable to integrate RF duplexers and filters as part of a radio-on-a-chip with a manufacturable technology.

Bulk acoustic resonators have been used to implement filters. One advantage of using acoustic resonators is that the speed of sound is approximately three or four orders of magnitude smaller than the speed of light, making the wavelengths, and thus the dimensions of a device, small compared with conventional (L-C) tank circuits.

Film bulk acoustic resonator filter die are placed within hermetically sealed packages. In the prior art, wire bonds are used to attach a die to leads of a package.

Flip-chip bonding has been used for making connections between a semiconductor chip and a package. In flip-chip bonding, wire bonds are not run between the chip and the package. Instead, bead-like projections are electrodeposited as terminals around one face of the chip. The face of the chip is then registered with the package terminals and bonded to them.

SUMMARY OF THE INVENTION

In accordance with the preferred embodiment of the present invention, a device includes a die that contains a filter circuit. The filter is implemented using film bulk acoustic resonators. A package contains the die. The package includes a base portion. Signal paths are incorporated in the base portion. Solder joints attach the die to the base portion. The solder joints electrically connect pads on the die to the signal paths in the base portion. The solder joints do not include, and are used instead of, wire bonds.

In one preferred embodiment, the package is made of ceramic material and is hermetically sealed. Alternatively, the package may be made of other materials.

Use of the present invention facilitates moving a ground plane closer to the die, thereby reducing mutual inductance. Use of the present invention also results in a large reduction of parasitic inductance due to long bond wires.

DESCRIPTION OF THE PREFERRED EMBODIMENT

Figure 1:
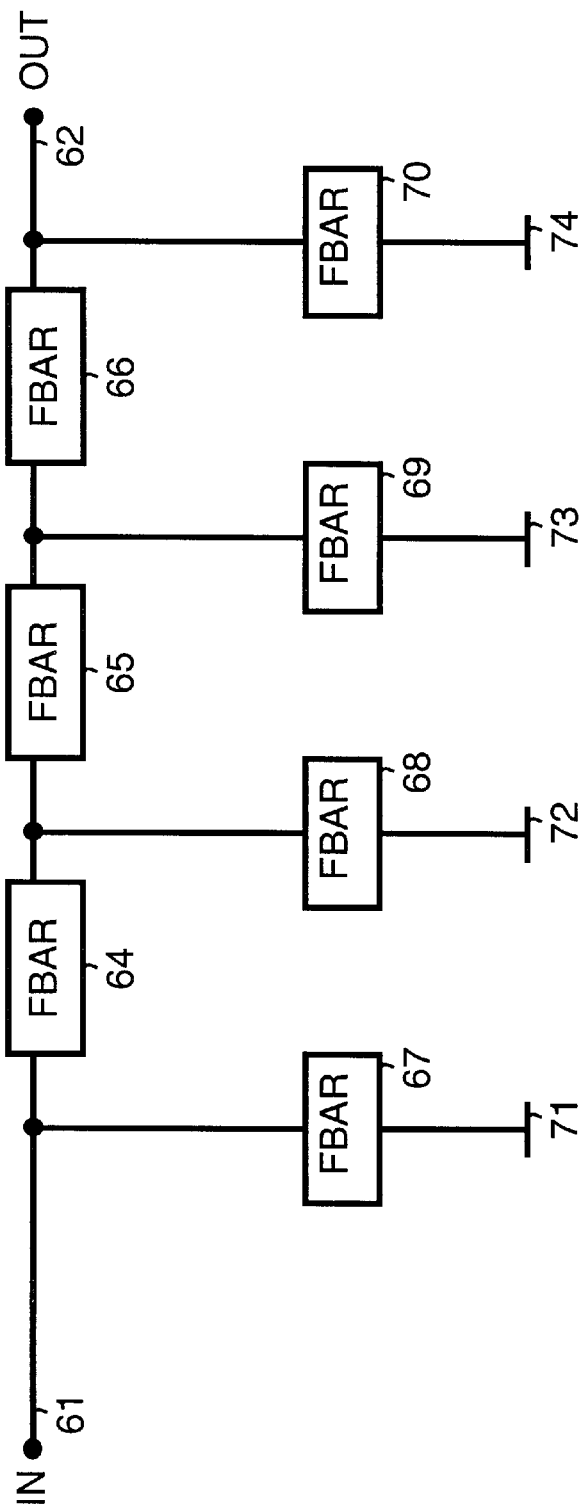
FIG. 1 is a simplified block diagram of a filter circuit implemented using film bulk acoustic resonators (FBARs) in accordance with the prior art.

FIG. 1 is a simplified block diagram of a filter circuit implemented using film bulk acoustic resonators (FBARs) connected in a conventional ladder configuration. The configuration shown in FIG. 1 is an example configuration. As will be understood by persons of skill in the art, many other configurations could be utilized.

In FIG. 1, a film bulk acoustic resonator (FBAR) 64, an FBAR 65 and an FBAR 66 are connected in series between a filter input 61. An FBAR 67 is connected in a shunt configuration to a ground node 71. An FBAR 68 is connected in a shunt configuration to a ground node 72. An FBAR 69 is connected in a shunt configuration to a ground node 73. An FBAR 70 is connected in a shunt configuration to a ground node 74. In more complex filters circuits, additional FBARs can be used requiring additional ground nodes. For example, FBAR 64, FBAR 65 and FBAR 66 each has a passband frequency centered at a frequency $f_0$. FBAR 67, FBAR 68, FBAR 69 and FBAR 70 each has a passband frequency centered at a frequency $f_0 + \Delta f_0$.

In order for proper operation of the filter circuit, ground node 71, ground node 72, ground node 73 and ground node 74 must be independent of each other. This requires multiple (i.e., numerous) input/output pads on a chip embodying the filter circuit. Using traditional packaging with wire bonds may result in each ground node having a slightly different parasitic value (inductance in particular). This can result in performance problems, particularly for linear, low noise and/or power applications. More importantly, using traditional packaging with wire bonds results in larger mutual inductances between connections.

Figure 2:
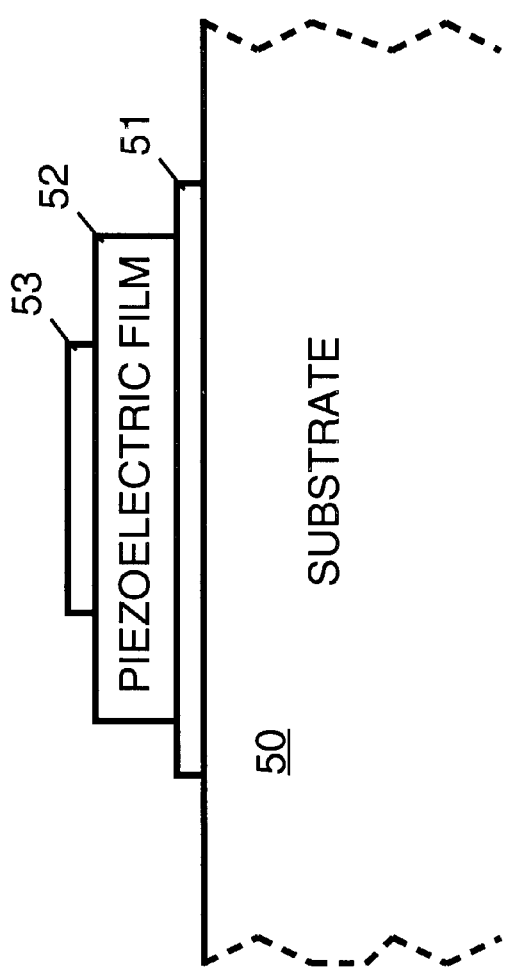
FIG. 2 is a sectional view of a basic bulk acoustic resonator in accordance with the prior art.

FIG. 2 is a sectional view of a basic bulk acoustic resonator. An aluminum nitride film 52 is sandwiched between an electrode 53 and an electrode 51. Electrode 51 is placed on a substrate 50.

Figure 3:
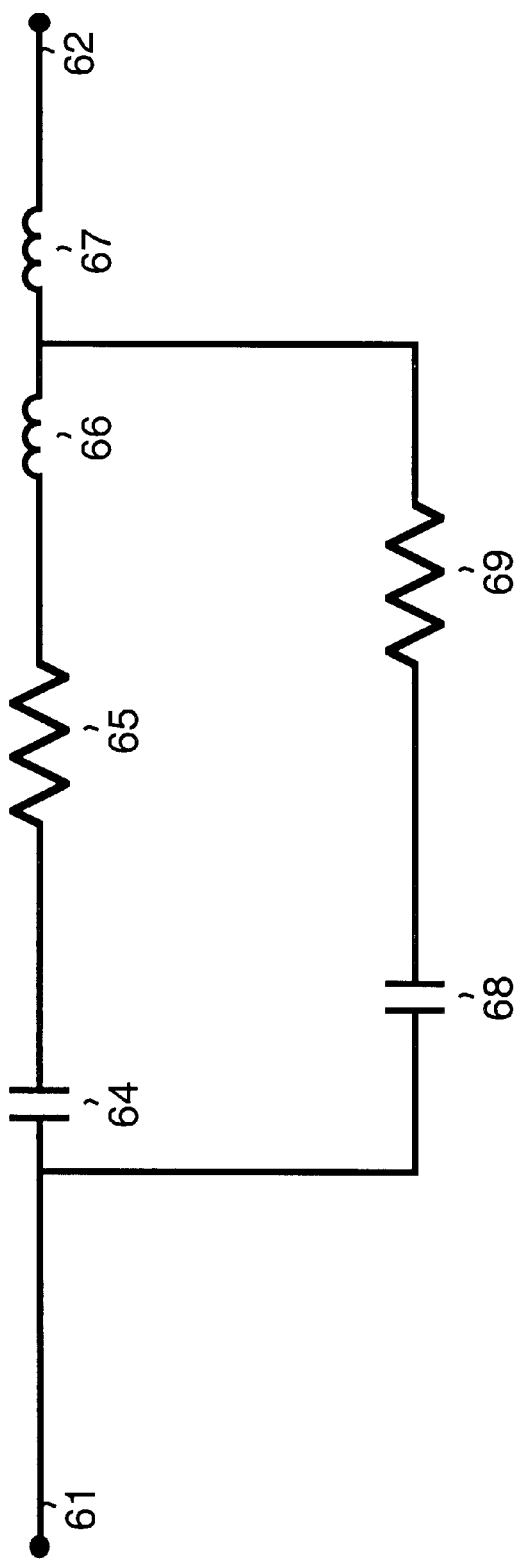
FIG. 3 is an equivalent circuit for a bulk acoustic resonator in accordance with the prior art.

FIG. 3 is an equivalent circuit for the bulk acoustic resonator shown in FIG. 2. An input 61 represents a connection to electrode 53 shown in FIG. 2. An input 62 represents a connection to electrode 51 through substrate 50 shown in FIG. 2. An inductor 67 represents series inductance. A capacitor 64 represents motion capacitance through aluminum nitride film 52 (shown in FIG. 2). A resistor 65 represents motion resistance through aluminum nitride film 52 (shown in FIG. 2). An inductor 66 represents motion inductance through aluminum nitride film 52 (shown in FIG. 2). A capacitor 68 represents capacitance within electrode 51 and electrode 52 (shown in FIG. 2). A resistor 69 represents resistance within electrode 51 and electrode 52 (shown in FIG. 2).

Figure 4:
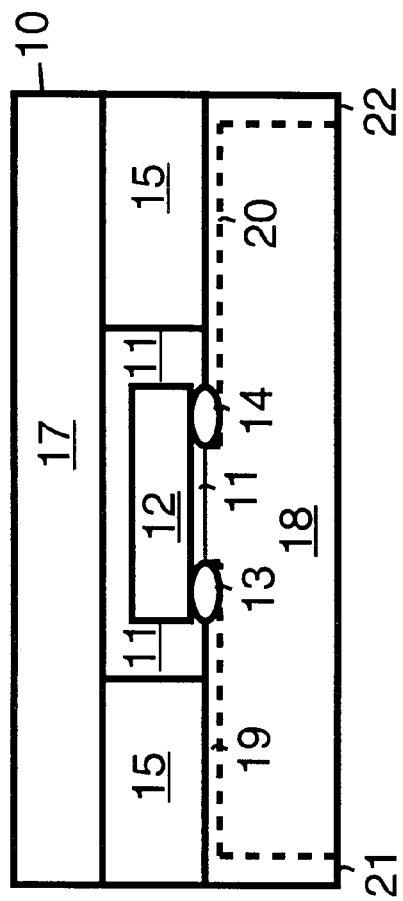
FIG. 4 shows a film bulk acoustic resonator filter die mounted in a microwave package using flip chip bonding technology in accordance with a preferred embodiment of the present invention.

FIG. 4 shows a film bulk acoustic resonator (FBAR) filter die 12 mounted in a microwave package using flip chip bonding technology in accordance with a preferred embodiment of the present invention. FBAR filter die 12 includes a film bulk acoustic resonator filter circuit such as that shown in FIG. 1. Bonding pads of FBAR filter die 12 are attached via solder joints to signal paths within a bottom layer 18 of a ceramic package 10. This is illustrated in FIG. 4 by a solder joint 13 being used to attach a bonding pad of FBAR filter die 12 to signal path 19 located within bottom layer 18 of ceramic package 10, and by a solder joint 14 being used to attach another bonding pad of FBAR filter die 12 to signal path 20 located within bottom layer 18 of ceramic package 10.

When bottom layer 18 is attached to a printed circuit board (PCB), signal path 19 is electrically connected to a lead on the PCB at a joint 21. Likewise, signal path 20 is electrically connected to a lead on the PCB at a joint 22.

In addition to a bottom layer 18, ceramic package 10 includes a ceramic section 15 that surrounds FBAR filter die 12. Ceramic package 10 also includes a ceramic lid 17 that covers FBAR filter die 12. Ceramic package 10 provides a hermetic seal around FBAR filter die 12. Within ceramic package 10, air/gas 11 separates FBAR filter die 12 from ceramic package 10. For example, air/gas 11 is composed of oxygen and/or nitrogen and/or some other combination of gases.

Elimination of wire bonds, when packaging FBAR filter die results in a reduction of parasitic inductance due to long bond wires. Elimination of bond wires also facilitates moving a ground plane within ceramic package 10 closer to FBAR filter die 12, thereby reducing mutual inductance.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A device comprising:
    a die that contains a filter circuit, the filter circuit being implemented using film bulk acoustic resonators;
    a package that contains the die, the package including a base layer, signal paths being incorporated in the base layer; and,
    solder joints that attach the die directly to the base layer, the solder joints electrically connecting pads on the die to the signal paths in the base layer, wherein the solder joints do not include, and are used instead of, wire bonds.

2. A device as in claim 1 wherein the package is comprised of ceramic material.

3. A device as in claim 2 wherein the package is hermetically sealed.

4. A device as in claim 1 wherein the package is hermetically sealed.

5. A method comprising the following steps:
    (a) fabricating a filter circuit within a die, the filter being implemented using film bulk acoustic resonators; and,
    (b) placing the die within a package, including the following substep:
        (b.1) attaching the die to directly to a base layer of the package using solder joints, the solder joints electrically connecting pads on the die to signal paths in the base layer, wherein the solder joints do not include, and are used instead of, wire bonds.

6. A method as in claim 5 wherein step (b) additionally includes the following substep:
    (b.2) hermetically sealing the die within the package.

7. A method as in claim 6 wherein in step (b) the package is comprised of ceramic material.

8. A method as in claim 5 wherein in step (b) the package is comprised of ceramic material.

9. A method comprising the following steps:
    (a) fabricating a filter circuit within a die, the filter being implemented using film bulk acoustic resonators; and,
    (b) placing the die within a package using flip-chip bonding, including the following substep:
        (b.1) attaching the die directly to a base layer of the package using solder joints, the solder joints electrically connecting pads on the die to signal paths in the base layer.

10. A method as in claim 9 additionally comprising the following step:
    (c) hermetically sealing the die within the package.

11. A method as in claim 10 wherein in step (b) the package is comprised of ceramic material.

12. A method as in claim 9 wherein in step (b) the package is comprised of ceramic material.

* * * * *